US010368434B2

United States Patent
Nakagawa

(10) Patent No.: US 10,368,434 B2
(45) Date of Patent: Jul. 30, 2019

(54) MANUFACTURING METHOD OF A DISPLAY DEVICE COMPRISING A GROOVE FORMED OUTSIDE A TERMINAL

(71) Applicant: Japan Display Inc., Tokyo (JP)

(72) Inventor: Takuya Nakagawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/284,595

(22) Filed: Oct. 4, 2016

(65) Prior Publication Data

US 2017/0188449 A1    Jun. 29, 2017

(30) Foreign Application Priority Data

Dec. 25, 2015   (JP) .................. 2015-252929

(51) Int. Cl.
| | |
|---|---|
| *H01L 27/32* | (2006.01) |
| *H05K 1/02* | (2006.01) |
| *H01L 27/12* | (2006.01) |
| *H05K 1/11* | (2006.01) |
| *H05K 3/00* | (2006.01) |

(Continued)

(52) U.S. Cl.
CPC .......... *H05K 1/028* (2013.01); *H01L 27/124* (2013.01); *H01L 27/1266* (2013.01); *H01L 51/003* (2013.01); *H05K 1/11* (2013.01); *H05K 3/007* (2013.01); *H05K 3/0026* (2013.01); *H05K 3/4007* (2013.01); *H01L 27/3276* (2013.01); *H01L 2227/326* (2013.01); *H01L 2251/5338* (2013.01); *H05K 3/361* (2013.01);

(Continued)

(58) Field of Classification Search
CPC .............. H01L 27/124; H01L 27/1266; H01L 27/3276; H05K 1/11; H05K 3/007; H05K 3/4007

See application file for complete search history.

(56) References Cited

U.S. PATENT DOCUMENTS

| | | | |
|---|---|---|---|
| 2006/0110863 A1* | 5/2006 | Yamamoto | ........ H01L 21/02532 438/149 |
| 2007/0134473 A1* | 6/2007 | Kim | ..................... H05K 1/0281 428/209 |

(Continued)

FOREIGN PATENT DOCUMENTS

| | | |
|---|---|---|
| JP | 2014-235294 A | 12/2014 |
| JP | 2015-195106 A | 11/2015 |

OTHER PUBLICATIONS

Japanese Office Action dated Jul. 3, 2018 for the corresponding Japanese patent application No. 2015-252929 with partial English translation.

*Primary Examiner* — Yu Chen
*Assistant Examiner* — Christopher M Roland
(74) *Attorney, Agent, or Firm* — Michael Best & Friedrich LLP

(57) ABSTRACT

Provided is a display device and a manufacturing method of the same. The display device includes: a base substrate having a top surface and a side surface, a display region over the top surface, a terminal over the top surface and between the display region and the side surface, the terminal being electrically connected to the display region, and an anisotropic conductive film over the terminal. An edge portion of the anisotropic conductive film is spaced from the side surface, and its distance is equal to or larger than 10 μm and equal to or smaller than 1 mm.

12 Claims, 14 Drawing Sheets

(51) Int. Cl.
   *H05K 3/40*     (2006.01)
   *H01L 51/00*    (2006.01)
   *H05K 3/36*     (2006.01)

(52) U.S. Cl.
   CPC .............. *H05K 2201/09036* (2013.01); *H05K 2201/10128* (2013.01); *H05K 2203/107* (2013.01)

(56) References Cited

U.S. PATENT DOCUMENTS

| | | | |
|---|---|---|---|
| 2011/0073890 A1* | 3/2011 | Sugizaki | H01L 33/0079 257/98 |
| 2011/0134018 A1 | 6/2011 | Seo et al. | |
| 2013/0264103 A1* | 10/2013 | Ye | H05K 1/0213 174/254 |
| 2014/0190621 A1* | 7/2014 | Kawata | B32B 38/10 156/155 |
| 2014/0353637 A1* | 12/2014 | Kawata | H01L 27/3272 257/40 |
| 2015/0214255 A1* | 7/2015 | Chikama | H01L 29/66765 257/43 |
| 2015/0280127 A1 | 10/2015 | Suzuki | |
| 2016/0278210 A1* | 9/2016 | Tsuruoka | H05K 1/144 |

\* cited by examiner

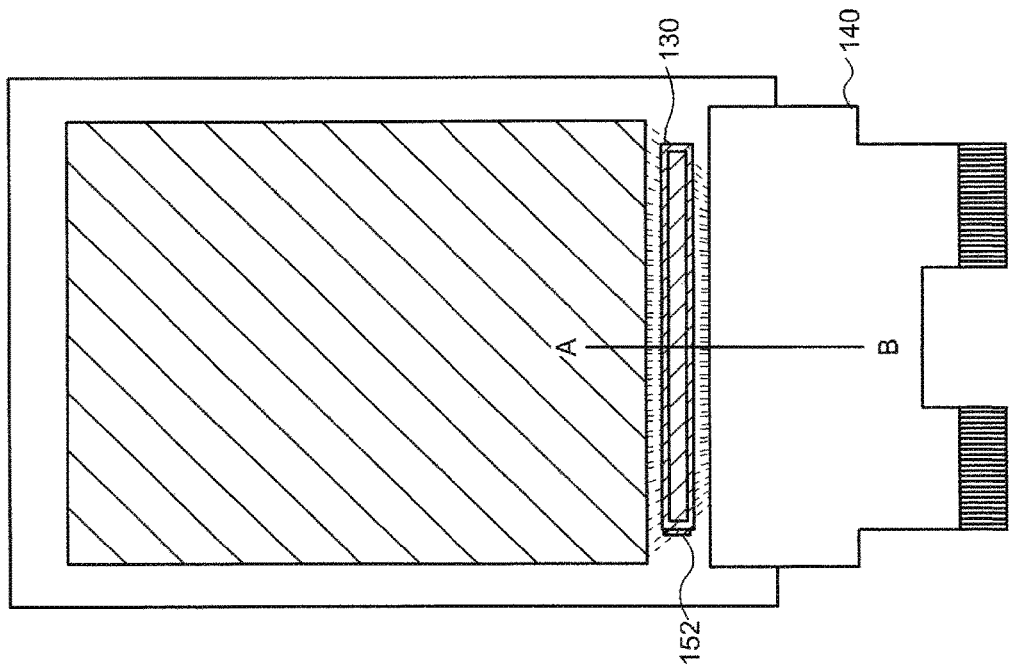
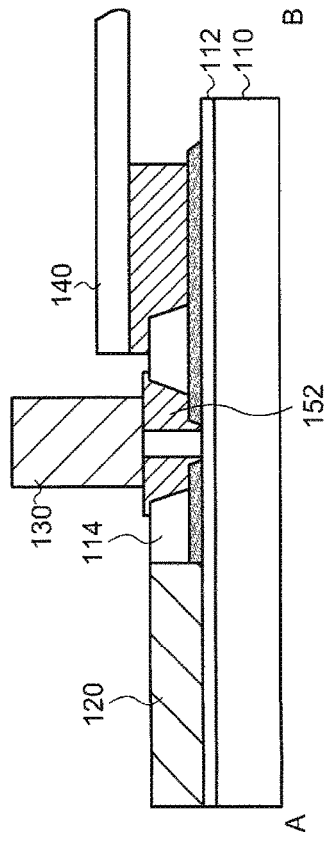
FIG. 8A
FIG. 8B

US 10,368,434 B2

MANUFACTURING METHOD OF A DISPLAY DEVICE COMPRISING A GROOVE FORMED OUTSIDE A TERMINAL

CROSS REFERENCE TO RELATED APPLICATIONS

This application is based on and claims the benefit of priority from the prior Japanese Patent Application No. 2015-252929, filed on Dec. 25, 2015, the entire contents of which are incorporate herein by reference.

FIELD

This invention relates to a display device and a manufacturing method of the same. For example, this invention relates to an organic EL display device or a flexible organic EL display device and a manufacturing method thereof.

BACKGROUND

A display device having a plurality of pixels formed over a substrate has been known. As a typical example of such a display device, a liquid crystal display device, an EL display device, and the like are represented.

An EL display device is a display device having pixels each including a light-emitting element with a structure in which a material exhibiting an electroluminescence (EL) phenomenon is sandwiched by a pair of electrodes. A light-emitting element using an organic compound as a material is called an organic light-emitting element, an organic EL element, or an organic electroluminescent element. A display device having a plurality of such organic light-emitting elements is called an organic EL display device.

An organic EL display device has a plurality of organic light-emitting elements (hereinafter, referred to as light-emitting elements) formed over a substrate, and the light-emitting elements are each controlled by a switching element such as a transistor to display an image. As a substrate, a glass substrate, a metal substrate, a ceramic substrate, or the like can be used, and the use of a flexible substrate such as a substrate including a resin allows the fabrication of a flexible organic EL display device (e.g., US patent application publication No. 2011/0134018).

SUMMARY

An embodiment of the present invention is a display device including a base substrate having a top surface and a side surface, a display region over the top surface, a terminal which is located over the top surface and between the display region and the side surface and which is electrically connected to the display region, and an anisotropic conductive film over the terminal, where an edge portion of the anisotropic conductive film is spaced from the side surface.

An embodiment of the present invention is a manufacturing method of a display device. The manufacturing method includes disposing a base substrate on a supporting substrate having a top surface and a side surface, forming a display region and a terminal over a surface of the base substrate, the surface of the base substrate overlaps the top surface, so that the terminal is sandwiched between the display region and the side surface, forming a trench by removing a part of the substrate which is located in a region between the side surface and the terminal, and separating the supporting substrate from the base substrate.

An embodiment of the present invention is a manufacturing method of a display device. The manufacturing method includes disposing a base substrate over a supporting substrate having a top surface and a side surface, forming a display region and a terminal over a surface which overlaps with the top surface of the base substrate so that the terminal is sandwiched between the display region and the side surface and that the display region and the terminal are electrically connected to each other, forming a plurality of trenches by removing a part of the substrate so as to surround the display region and the terminal, and separating the supporting substrate from the base substrate.

BRIEF DESCRIPTION OF DRAWINGS

FIG. 8A and FIG. 8B are drawings showing a fabrication method of a display device of an embodiment of the present invention;

DESCRIPTION OF EMBODIMENTS

Figure 1:
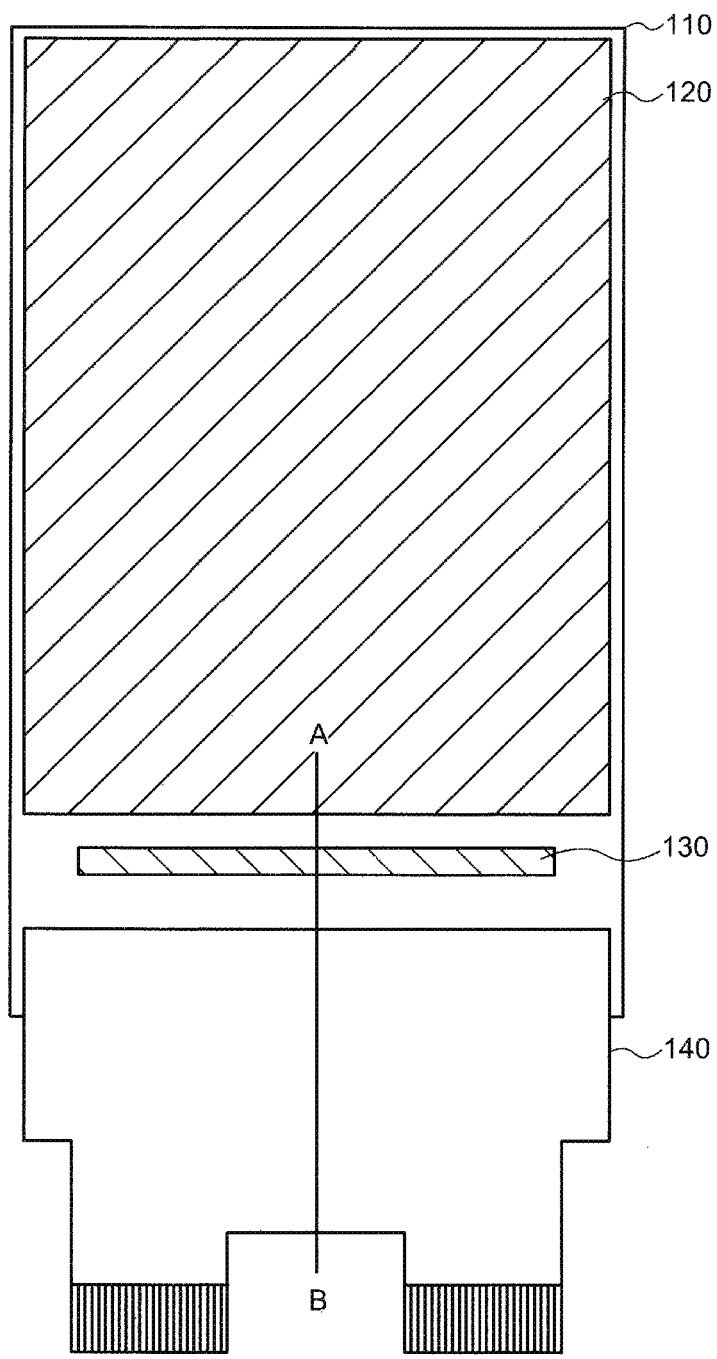
FIG. 1 is a top view of a display device of an embodiment of the present invention.

A purpose of the present invention is to supply a flexible display device such as a flexible organic EL display device. Alternatively, a purpose of the present invention is to provide a method for readily manufacturing a flexible organic EL display device at a high yield.

Hereinafter, the embodiments of the present invention are explained with reference to the drawings. Note that the present invention can be implemented in a variety of modes within the concept of the invention, and the interpretation of the present invention should not be limited by the disclosure in the embodiments represented below.

In the drawings, the width, thickness, shape, and the like of each component may be schematically illustrated and different from those of an actual mode in order to provide a clearer explanation. However, the drawings simply give an example and do not limit the interpretation of the present invention. In the specification and each of the drawings, the same reference number is provided to an element which is the same as that appearing in preceding drawings, and the detailed explanation may be omitted as appropriate.

Embodiment 1

In the present embodiment, a structure of a display device of an embodiment of the present invention is explained with reference to FIG. 1 to FIG. 3C. A schematic top view of the display device 100 is shown in FIG. 1. The display device 100 has a base substrate 110 and a display region 120 over the base substrate 110. The display device 100 further includes a connector 140 overlapping with the base substrate 110, and an IC (Integrated Circuit) chip 130 is disposed between the connector 140 and the display region 120.

A plurality of pixels (not shown) is provided in the display region 120 to reproduce an image. A display element and one or a plurality of transistors electrically connected thereto is provided in each pixel, and each display element is controlled by the transistors. Each pixel is electrically connected to the IC chip 130 and driven in accordance with an image signal input from outside through the connector 140. A flexible printed circuit (FPC) or the like is represented as the connector 140.

An organic EL light-emitting element is represented as the display element for example. The display region 120 may be formed with light-emitting elements giving different colors. Alternatively, the display region 120 may be formed by using light-emitting elements giving white light in all of the pixels, and the desired emission color may be extracted from each element by using a color filter.

The IC chip 130 is fabricated, for example, by using a semiconductor substrate fixed over the base substrate 110 or the connector 140, and functions as a driving circuit for controlling the transistors in each pixel. Another driving circuit may be additionally disposed in a periphery of the display region 120. Alternatively, a driving circuit may be provided in the periphery of the display region instead of the IC chip 130.

Figure 2:
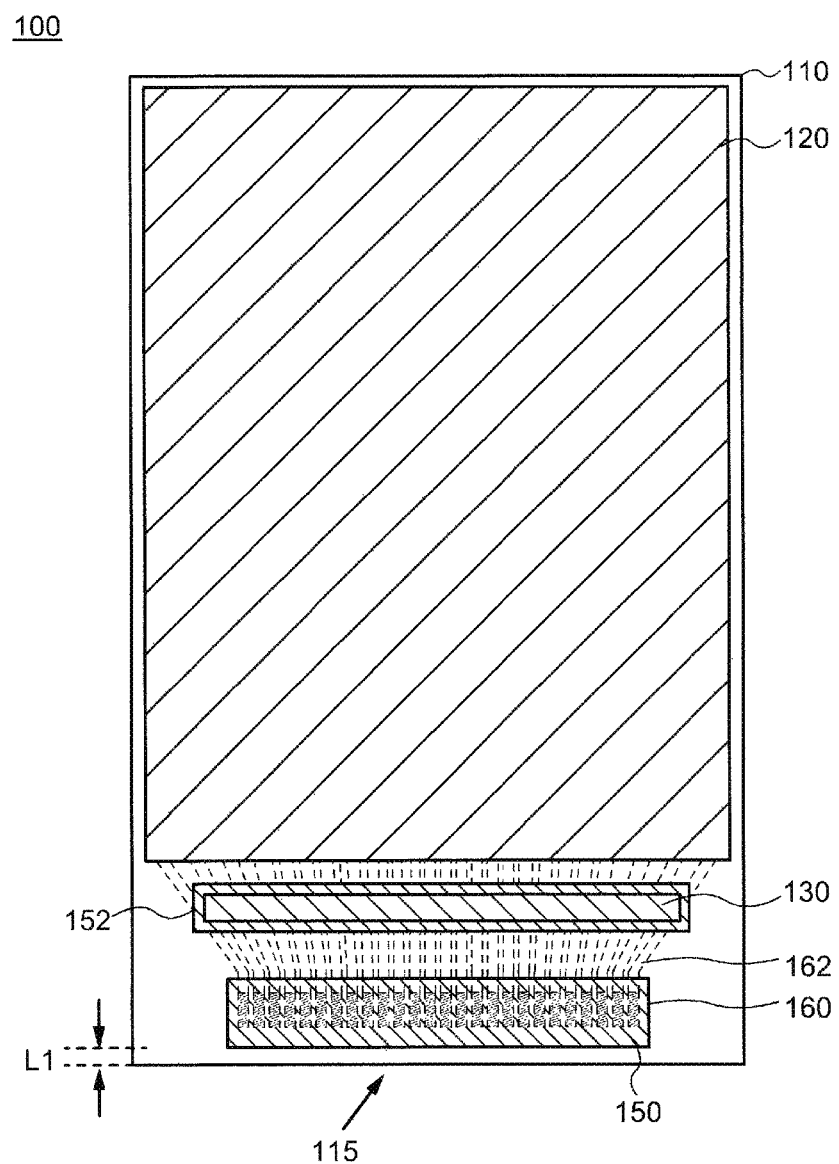
FIG. 2 is a top view of a display device of an embodiment of the present invention.

A structure which is obtained by removing the connector 140 from the display device 100 of FIG. 1 is shown in FIG. 2. Wiring 162 extending from the display region 120 to a side surface 115 (a side surface on the terminal 160 side selected from the side surfaces of the base substrate 110) of the base substrate 110 are arranged. The wiring 162 are electrically connected to the display region 120 and the IC chip 130. A part of the wiring 162 is exposed and the exposed portions function as the terminals 160. The terminals 160 are connected to the connector 140 with a conductive film 150 such as an anisotropic conductive film. An edge portion of the conductive film 150 is spaced from the side surface 115 which overlaps with the connector 140, and the distance L1 therebetween is preferably 10 μm to 1 mm and more preferably 25 μm to 200 μm.

Figure 3A:
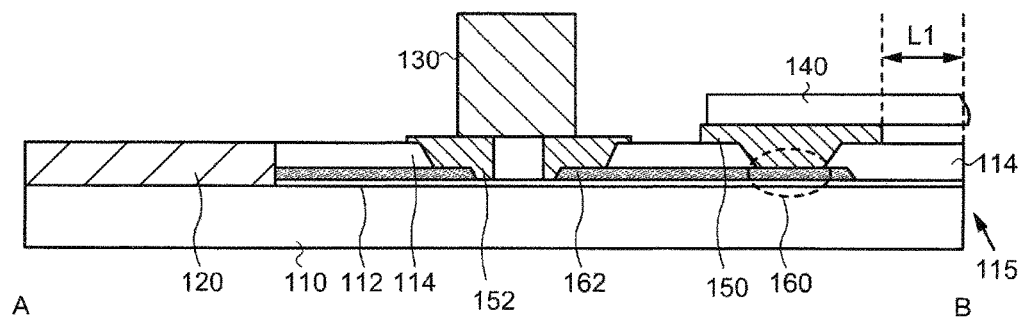
FIG. 3A to FIG. 3C are each a cross-sectional view of a display device of an embodiment of the present invention.

An example of a schematic cross-sectional view along straight line A-B of FIG. 1 is shown in FIG. 3A. The display region 120 is formed over the base substrate 110. The wiring 162 is provided over a first insulating film 112 which is located over the base substrate 110. Although the wiring 162 extends from the display region 120 to the side surface 115 of the base substrate 110, the edge portion thereof is spaced from the side surface 115. The first insulating film 112 can be formed by using a base film employed in the display region 120, a gate insulating film or a protection film used in the transistors in the display region 120, an interlayer insulating film which is formed over the transistors and absorbs projections and depressions, and the like. Note that the first insulating film 112 is not always necessary and the wiring 162 may be in direct contact with the base substrate 110. In the present embodiment, an example is shown in which the first insulating film 112 is formed by using the base film disposed under the transistors in the display region 120.

A second insulating film 114 is provided over the wiring 162, and the wiring 162 is exposed in two opening portions formed in the second insulating film 114. In the opening portion on the side close to the display region 120, the IC chip 130 is connected to the wiring 162 with the conductive film 152 such as an anisotropic conductive film. A portion which is exposed in the other opening portion (a region surrounded by a dotted line) is the terminal 160. The second insulating film 114 can be formed with the gate insulating film, the protection film, the interlayer insulating film, and the like used in the display region 120.

The connector 140 is fixed over the terminal 160 with the conductive film 150 such as an anisotropic conductive film, by which the terminal 160 and the connector 140 are electrically connected. As described above, the conductive film 150 is spaced from the side surface 115 of the base substrate 110. In other words, the conductive film 150 is not in contact with the side surface 115. Therefore, as shown in FIG. 3A, a space can exist between the connector 140 and the base substrate 110. The distance L1 between the edge portion of the conductive film 150 (the edge portion closer to the side surface 115) and the side surface 115 is in the region which is the same as the aforementioned region.

Figure 3B:
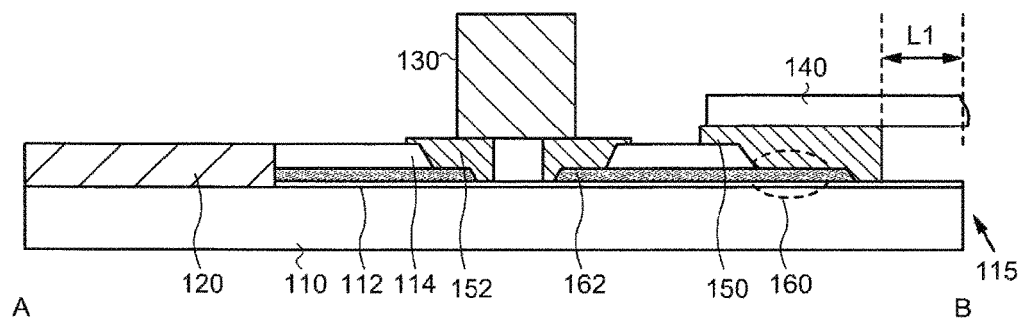

The edge portion closer to the side surface 115 of the terminal 160 is not necessarily covered by the second insulating film 114, and the edge portion (or side surface) of the terminal 160 may directly contact with the conductive film 150 as shown in FIG. 3B, for example. In this case, the conductive film 150 is also not in contact with but is spaced from the side surface 115. A preferred distance L1 between the edge portion of the conductive film 150 and the side surface 115 is in the region which is the same as the aforementioned region.

Figure 3C:
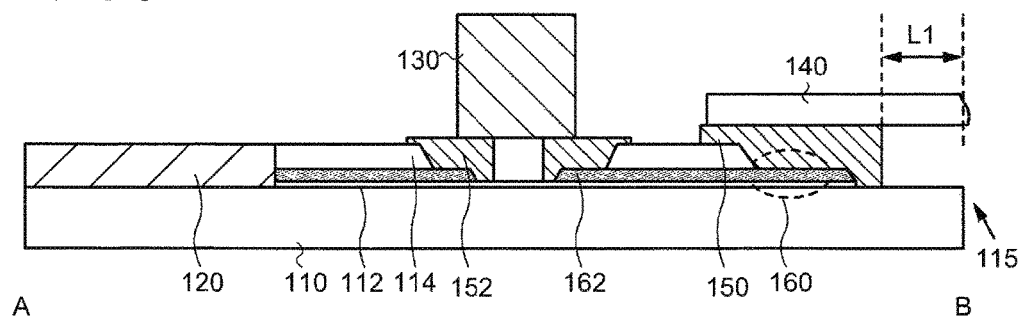

Furthermore, in a region between the terminal 160 and the side surface 115 of the base substrate 110, the first insulating film 112 is not always necessary, and, as shown in FIG. 3C, the base substrate 110 may be exposed in this region. A preferred distance L1 between the edge portion of the conductive film 150 and the side surface 115 is in the region which is the same as the aforementioned region.

As described in Embodiment 2 in detail, the display device 100 having the structure described in this embodiment can be readily manufactured at a good yield. In particular, this effect is remarkable when a flexible base substrate 110 is applied.

Embodiment 2

In this Embodiment, a manufacturing method of the display device 100 shown in Embodiment 1 is explained with reference to FIG. 4A to FIG. 9B, FIG. 13A, FIG. 13B, and FIG. 14. In FIG. 4A to FIG. 9B, top views of the display device 100 and cross-sectional views along line A-B shown in FIG. 1 are shown. Note that an explanation of the structures which are the same as those of Embodiment 1 may be omitted.

Figure 4A:
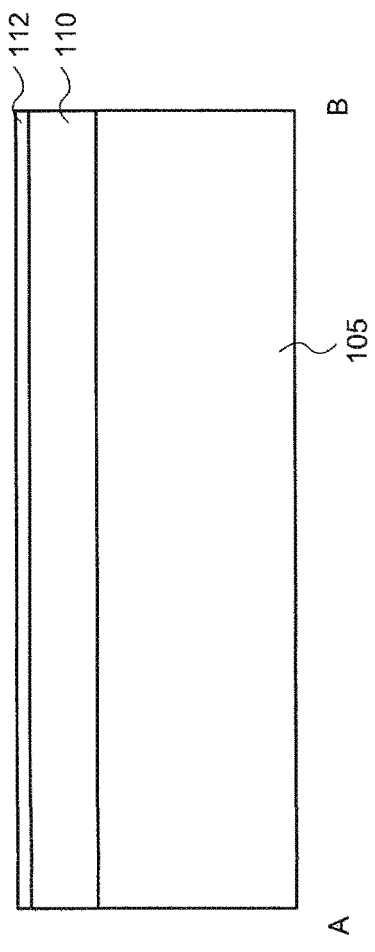
FIG. 4A and FIG. 4B are drawings showing a fabrication method of a display device of an embodiment of the present invention.
Figure 4B:
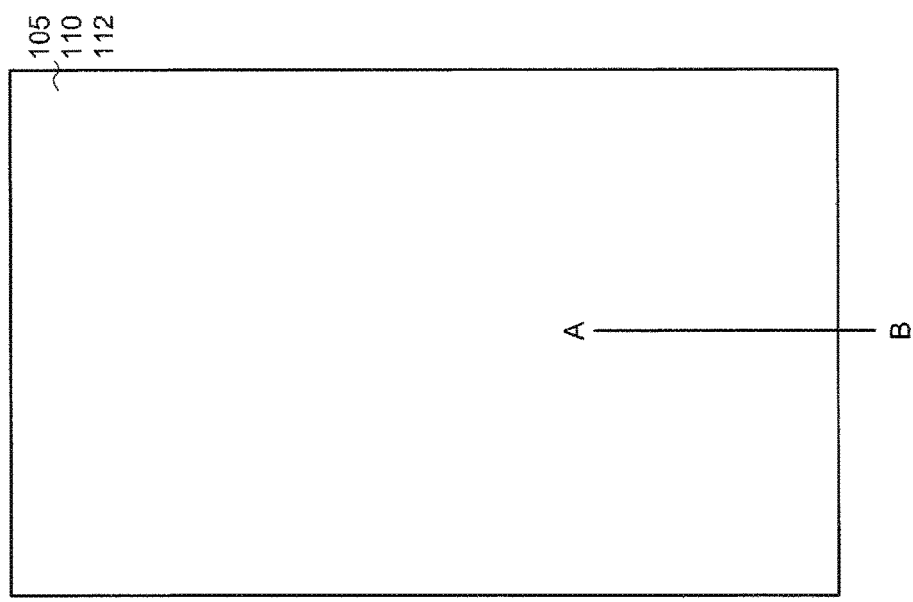
Figure 5A:
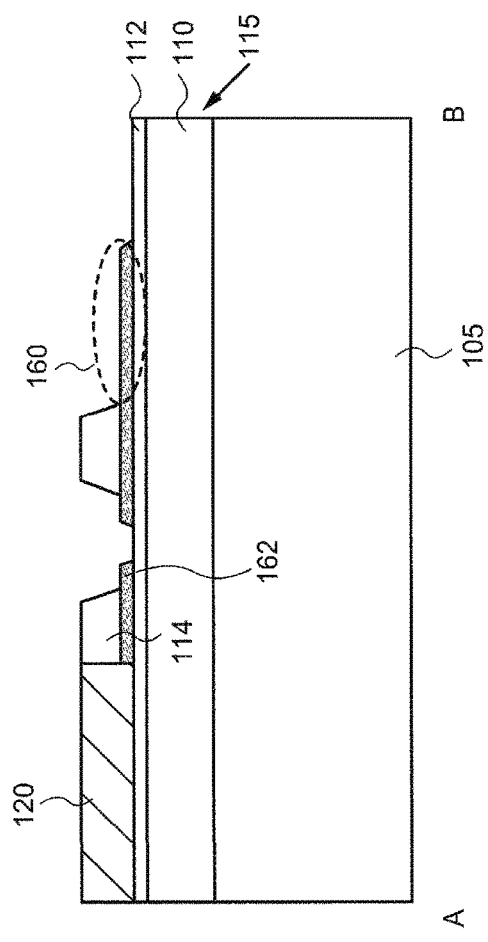
FIG. 5A and FIG. 5B are drawings showing a fabrication method of a display device of an embodiment of the present invention.
Figure 5B:
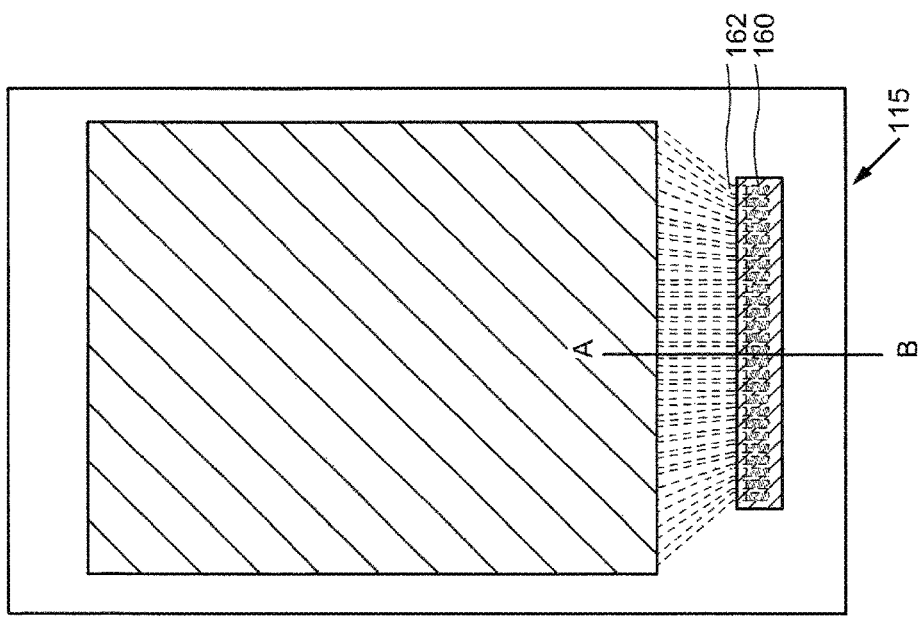

As shown in FIG. 4A and FIG. 4B, the base substrate 110 is formed over a supporting substrate 105. A material which can withstand the environment of the manufacturing process of the display device 100 can be used for the supporting substrate 105, and glass, ceramic, a metal, and the like can be used, for example. Although the drawings in the preset embodiment are illustrated so that one display device 100 is manufactured over the supporting substrate 105, a plurality of display devices 100 can be manufactured by forming a plurality of display devices 100 over the supporting substrate 105 and then dividing the supporting substrate 105 as appropriate.

A film of a polymer such as a polyimide may be used as the base substrate 110. It is preferred to use a film of a polymer capable of effectively absorbing laser light described below. Furthermore, a film of a polymer having low permeability to water, oxygen, and the like is preferred. The base substrate 110 may be formed by applying a solution or a mixture including the corresponding polymer material, and then performing heating. Alternatively, the base substrate 110 may be formed by applying a solution or a mixture of a precursor of the polymer material, and then performing polymerization under heating. Alternatively, a polymer film in a film state is arranged over the base substrate 110, and then applying pressure thereon. Note that the base substrate 110 may not be provided in the case where the following separation process of the supporting substrate 110 is not carried out, for example.

Following this, the first insulating film 112 is formed over the base substrate 110. This first insulating film 112 has a function of preventing diffusion of impurities from the supporting substrate 105 and the base substrate 110. An inorganic material such as silicon oxide, silicon nitride oxide, and silicon oxynitride can be used as the first insulating film 112. Note that the first insulating film 112 is not necessarily disposed. In this embodiment, although the first insulating film 112 is formed over the whole surface of the base substrate 110, it may be formed only in a partial region of the base substrate 110.

Next, the wiring 162 is formed between the display region 120 and the side surface 115 (the right side surface in FIG. 5A and the lower side surface in FIG. 5B) in addition to the display region 120. The wiring 162 is formed so as to extend to the side surface 115 from the display region 120, and a part thereof is disconnected for the connection with the IC chip 130. Furthermore, the wiring 162 is spaced from the side surface 115. The display region 120 includes transistors, and the wiring 162 can be formed by using conductive films employed in the formation of the gate electrodes, source electrodes, drain electrodes, and the like of the transistors. Alternatively, the wiring 162 can be formed by utilizing conductive films used when the electrodes of the light-emitting elements are formed.

The wiring 162 may have a single-layer structure or a stacked layer structure and can be formed by using a metal such as titanium, molybdenum, tungsten, tantalum, aluminum, copper, and chromium or an alloy thereof. Alternatively, a transparent conductive oxide such as indium-tin oxide and indium-zinc oxide can be used. For example, a stacked structure is represented in which a highly conductive metal (e.g., copper and aluminum) is sandwiched between metals having a high melting point (e.g., titanium, tungsten, and molybdenum). Alternatively, a structure is represented in which the transparent conductive oxide is stacked over the aforementioned metal or its stacked structure.

The second insulating film 114 is formed over the wiring 162. The second insulating film 114 can be formed, for example, by using the gate insulating film included in the transistors in the display region 120, the interlayer insulating film disposed over the transistors, and the like. For instance, it is possible to use an inorganic insulator such as silicon oxide, silicon nitride oxide, silicon oxynitride, and silicon nitride and an organic material such as an acrylic resin, a polyimide resin, and a polysiloxane resin.

A part of the second insulating film 114 is removed to form two opening portions, allowing a part of the wiring 162 to be exposed. The terminal 160 is formed in the opening portion which is closer to the side surface 115. The opening portions are formed by etching, laser irradiation and the like. Etching may be dry etching or wet etching.

In the case where a plurality of display devices 100 is fabricated over the supporting substrate 105, the supporting substrate 105 is divided into individual display devices 100 by using a scriber and the like.

Figure 6A:
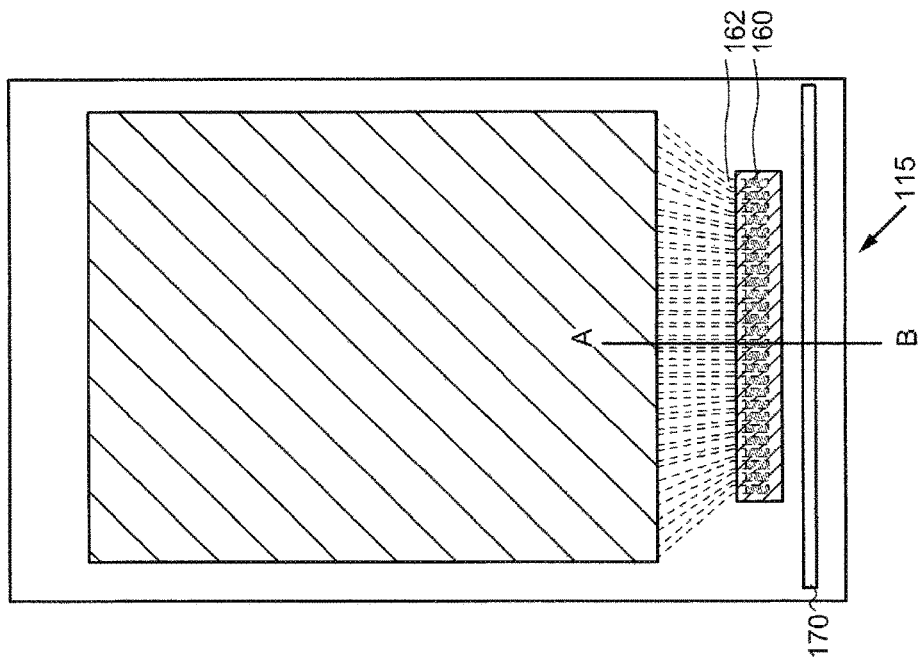
FIG. 6A and FIG. 6B are drawings showing a fabrication method of a display device of an embodiment of the present invention.
Figure 6B:
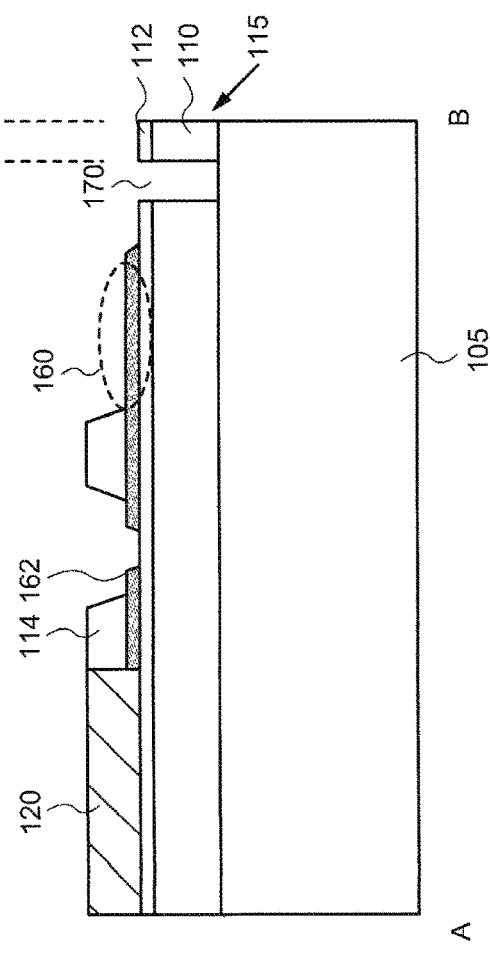

Next, as shown in FIG. 6A and FIG. 6B, the region between the side surface 115 of the base substrate 110 and the terminal 160 is irradiated with a laser to remove a part of the base substrate 110 and a part of the first insulating film 112, leading to the formation of a trench 170. The laser may be applied through the supporting substrate 105 or from an opposite side to the supporting substrate 105. At this time, it is preferred that a distance L2 between the trench 170 and the side surface 115 of the base substrate 110 be equal to or larger than 100 µm and equal to or smaller than 500 µm. The trench 170 is formed so as to be spaced from the edge portion (that is closer to the side surface 115 of the base substrate 110) of the terminal 160. Although an example is shown in which the trench 170 is formed only between the terminal 160 and the side surface 115 as shown in FIG. 6B in the present embodiment, the invention is not limited thereto, and the trench 170 may be formed in other regions. Such an embodiment will be described below. Note that the trench 170 may not be formed when the process (described below) to remove the supporting substrate 105 from the base substrate 110 is not carried out.

There is no limitation to the type and wavelength of the laser, and any laser having a wavelength absorbable by the irradiated base substrate 110 can be used. For example, a gas laser such as an excimer laser and a carbon dioxide gas laser, a solid laser such as a YAG laser, a semiconductor laser, a pigment laser, and the like can be used. The beam intersection of the laser may have a spot shape or a line shape.

Figure 7A:
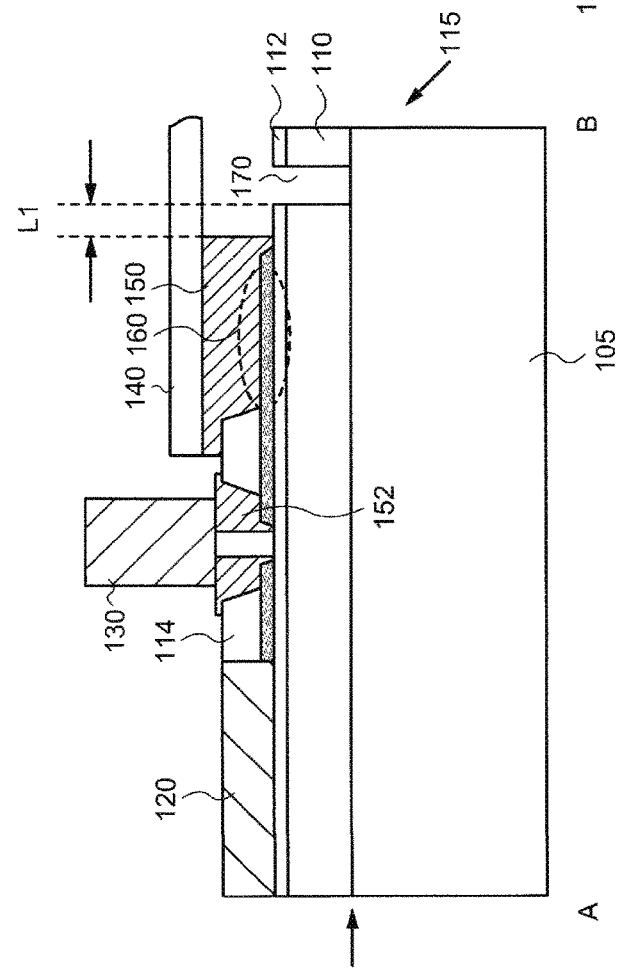
FIG. 7A and FIG. 7B are drawings showing a fabrication method of a display device of an embodiment of the present invention.
Figure 7B:
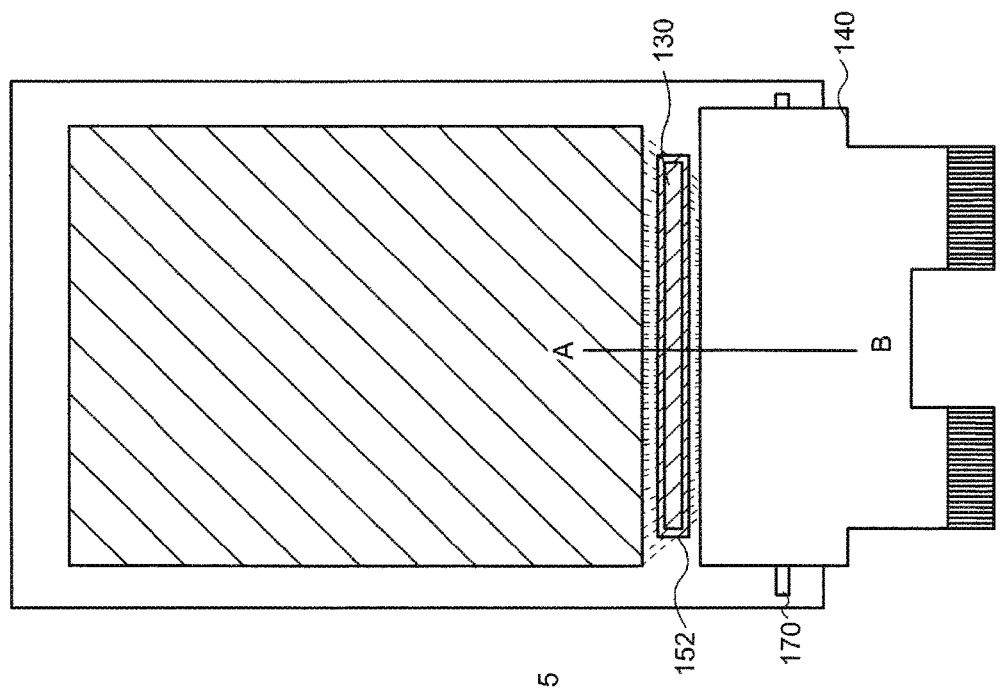

Next, as shown in FIG. 7A and FIG. 7B, the IC chip 130 is fixed over the second insulating film 114 in the opening portion closer to the display region 120 by using the conductive film 152 such as an anisotropic conductive film. Additionally, the connector 140 is connected to the terminal 160 by using the conductive film 150, resulting in the electrical connection between the terminal 160 and the connector 140. An FPC and the like can be used as the connector 140.

It is preferred that the edge portion (edge portion closer to the side surface 115) of the conductive film 150 and the trench 170 be spaced from each other. The distance L1 corresponds to the distance L1 in FIG. 3A to FIG. 3C. In other words, it is preferred that a sidewall of the trench 170 be not covered with the conductive film 150. In this case, a space can exist between the connector 140 and the base substrate 110.

Next, the remaining base substrate 110 is irradiated with a laser from the side of the supporting substrate 105 to reduce the adhesion between the base substrate 110 and the supporting substrate 105. The laser can be selected from the aforementioned lasers. The type and wavelength of the laser used here may be the same as or different from those of the lasers used in the formation of the trench 170. Although the beam intersection of the laser may be a spot shape or a line shape, the use of a laser having a line-shape beam intersection is preferred in view of the reduction of the irradiation time.

Figure 9A:
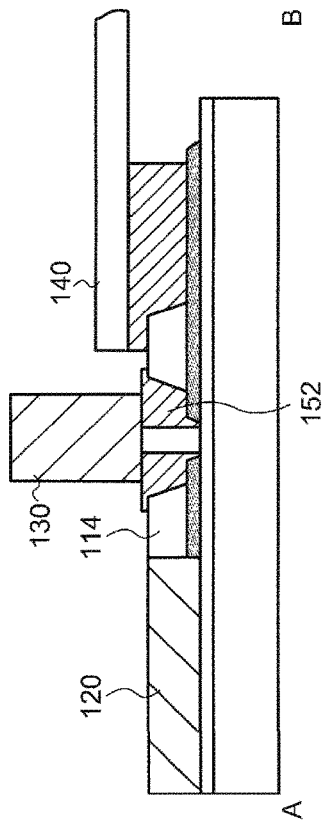
FIG. 9A and FIG. 9B are drawings showing a fabrication method of a display device of an embodiment of the present invention.
Figure 9B:
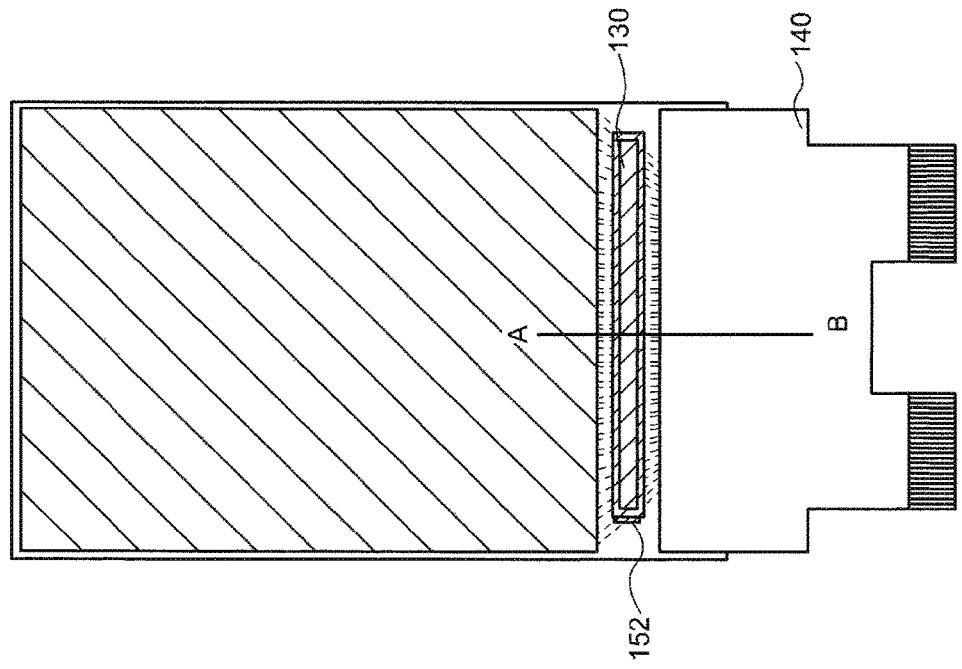

Next, the base substrate 110 and the supporting substrate 105 are separated from each other along an interface between the base substrate 110 and the supporting substrate 105 (arrow in FIG. 7A). The separation can be performed physically. For example, the supporting substrate 105 may be fixed by using a vacuum chuck, and then the structures provided over the base substrate 110 may be separated along the interface. By this process, the display device 100 having flexibility can be obtained. At this time, a part of the base substrate 110 and a part of the first insulating film 112, which are located between the trench 170 and the side surface 115, are separated from the display device 100. As shown in FIG. 9A and FIG. 9B, a peripheral portion of the base substrate 110 may be cut off if necessary.

Through the aforementioned processes, the display device 100 according to the present embodiment can be manufactured.

Figure 13A:
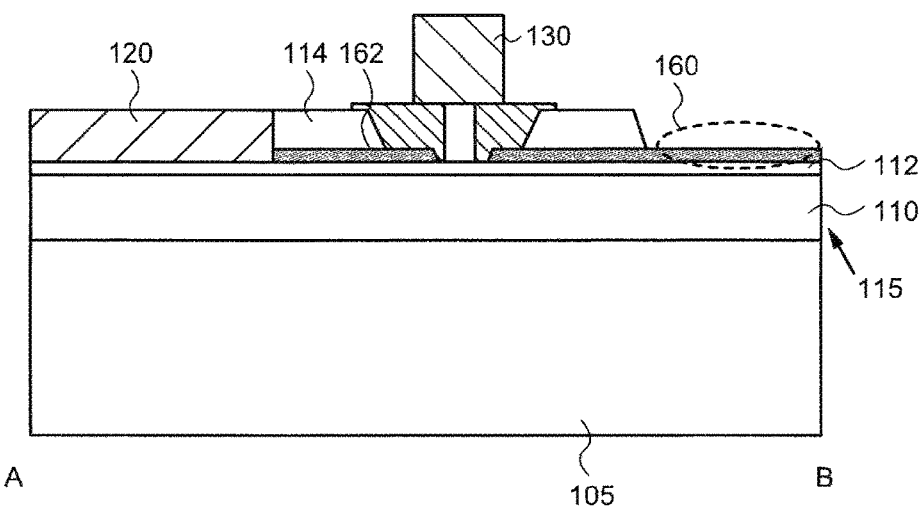
FIG. 13A and FIG. 13B are drawings each showing a modified example of a fabrication method of a display device of an embodiment of the present invention.
Figure 13B:
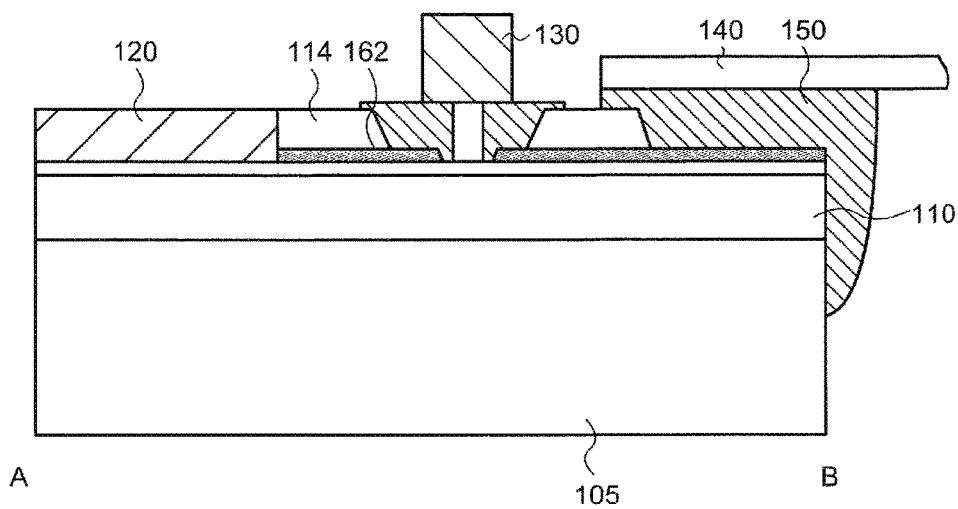
Figure 14:
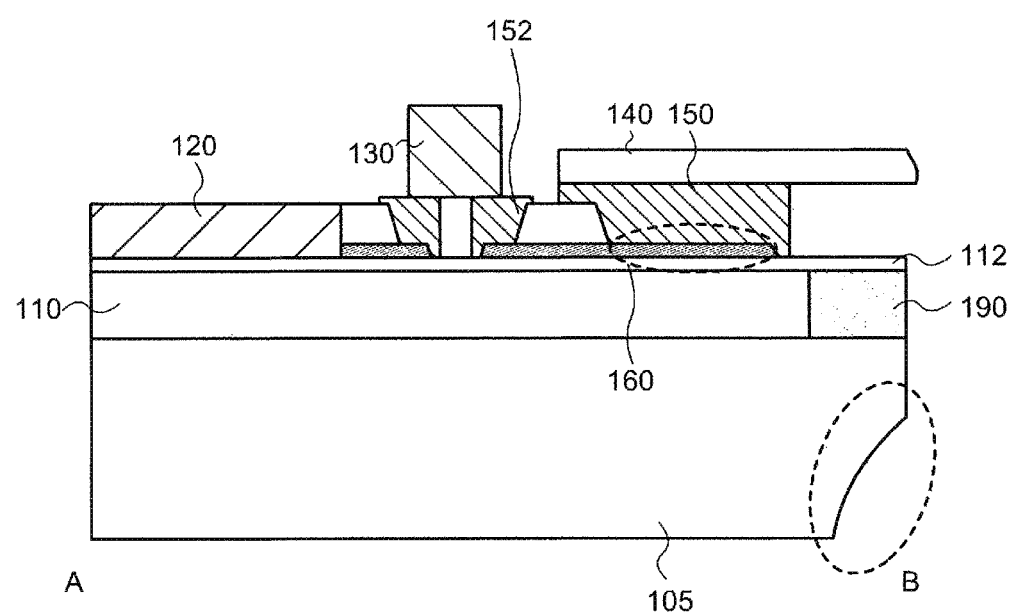
FIG. 14 is a drawing showing a modified example of a fabrication method of a display device of an embodiment of the present invention.

As described above, the wiring 162 is formed so as not to reach the edge portion of the base substrate 110 in the present embodiment. On the other hand, when the wiring 162 is formed so as to reach the side surface 115 of the base substrate 110 as shown in FIG. 13A, a part of the conductive film 150 used to connect the connector 140 overlaps with the side surface 115 of the base substrate 110 and a side surface of the supporting substrate 105 and inhibits the separation between the supporting substrate 150 and the base substrate 110. Therefore, it is preferred that the wiring 162 be formed so as not to reach the side surface 115 of the base substrate 110, according to the manufacturing method shown in FIG. 4A to FIG. 8B.

As described above, a plurality of display devices 100 can be fabricated by dividing the supporting substrate 105. In this case, however, as shown by the broken line of FIG. 14, an edge portion of the supporting substrate 105 is readily damaged, and a crack is easily caused at the edge portion when the division is performed. When a laser is applied from the lower side of the supporting substrate 105 in such a state, the laser is reflected or scattered at the damaged portion, and the laser is not sufficiently applied on a region 190 which overlaps with the base substrate 110. Hence, the adhesion between the region 190 and the supporting substrate is not sufficiently reduced, and the separation between the supporting substrate 105 and the base substrate 110 is inhibited, resulting in the reduction of the yield of the display device 100.

On the contrary, in the present embodiment, the trench 170 is formed by removing the region of the base substrate 110 between the side surface 115 and the terminal 160. Therefore, even if the adhesion between the base substrate 110 and the supporting substrate 105 is maintained between the trench 170 and the side surface 115 after the irradiation of the laser, the adhesion is reduced and the supporting substrate 105 is readily separated because the region from the trench 170 to the display region 120 is sufficiently irradiated with the laser. Hence, it is preferred that the trench 170 be formed by removing the region of the base substrate 110 between the side surface 115 and the terminal 160 according to the manufacturing method shown in FIG. 4A to FIG. 8B.

Embodiment 3

In this embodiment, a fabrication method of a display device 200, which is different from that of Embodiment 2, is explained. The manufacturing method shown in the present embodiment is different in layout of the trench 170 from that of Embodiment 2. Explanation of the structures which are the same as those of Embodiment 2 is omitted.

Figure 10:
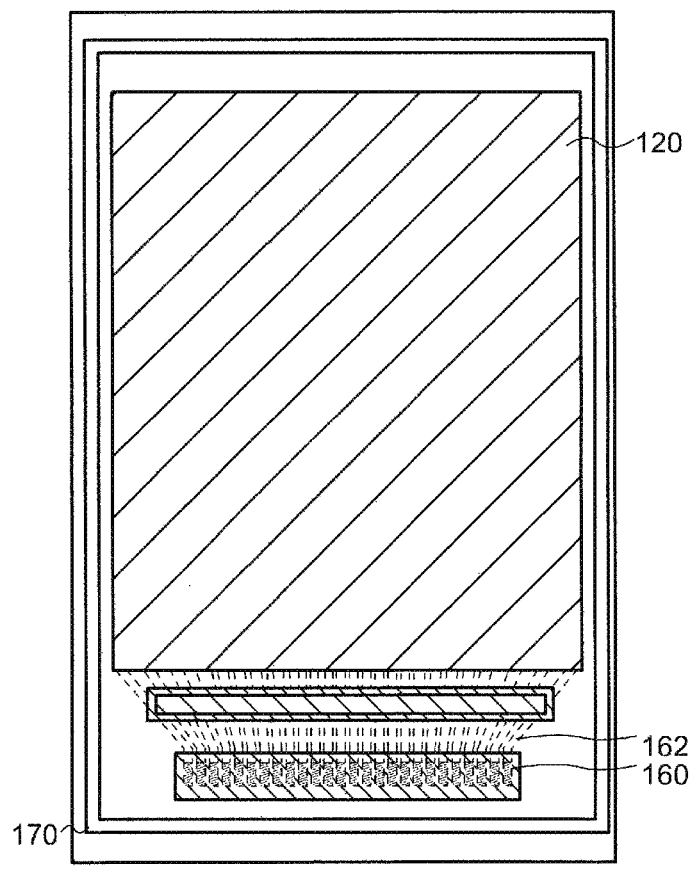
FIG. 10 is a drawing showing a fabrication method of a display device of an embodiment of the present invention.

In Embodiment 2, the trench 170 is formed only in the region between the side surface 115 of the base substrate 110 and the terminal 160. However, in the present embodiment, a single trench 170 is formed so as to surround the display region 120 and the terminal 160 as shown in FIG. 10. Although this trench 170 has a rectangular shape in FIG. 10, the shape is not limited thereto, and the trench 170 may have a shape (e.g., polygonal shape) other than a rectangular shape.

Application of such a structure enables separation of the supporting substrate 105 more easily and improvement of the manufacturing yield of the display device.

Embodiment 4

In this embodiment, a fabrication method of a display device 300, which is different from those of Embodiments 2 and 3, is explained. The manufacturing method shown in the present embodiment is different in layout of the trench 170 from those of Embodiments 2 and 3. Explanation of the structures which are the same as those of Embodiments 2 and 3 is omitted.

Figure 11:
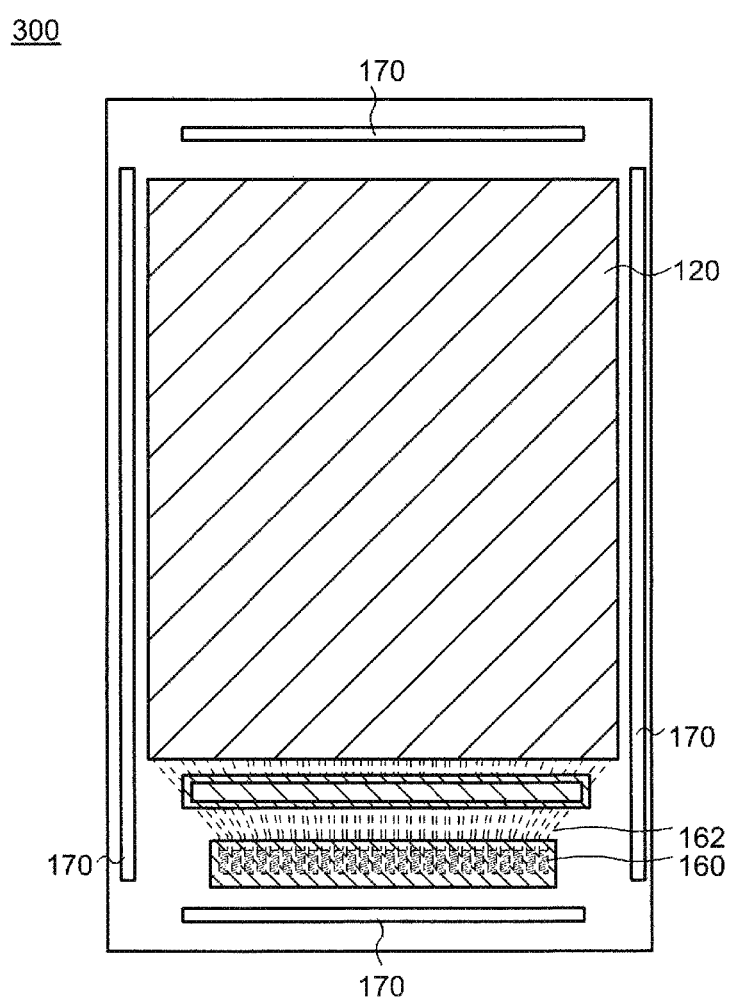
FIG. 11 is a drawing showing a fabrication method of a display device of an embodiment of the present invention.

In the present embodiment, a plurality of linear-shape trenches 170 is formed along each side of the display region 120 so as to surround the display region 120 and the terminal 160 as shown in FIG. 11. Therefore, the trenches 170 are formed discontinuously. In the present embodiment, each of the trenches 170 does not contain any bent portion and is linear.

The adhesion between the supporting substrate 105 and the base substrate 110 may be significantly decreased depending on the materials of the supporting substrate 105 and the base substrate 110 and the irradiation conditions of the laser. In this case, the supporting substrate 105 might be separated in an unexpected situation (e.g., during transportation). The adhesion between the supporting substrate 105 and the base substrate 110 can be readily controlled by applying the structure of the present embodiment.

Embodiment 5

In this embodiment, a fabrication method of a display device 400, which is different from those of Embodiments 2 to 4, is explained. The manufacturing method shown in the present embodiment is different in layout of the trench 170 from those of Embodiments 2 to 4. Explanation of the structures which are the same as those of Embodiments 2 to 4 is omitted.

Figure 12:
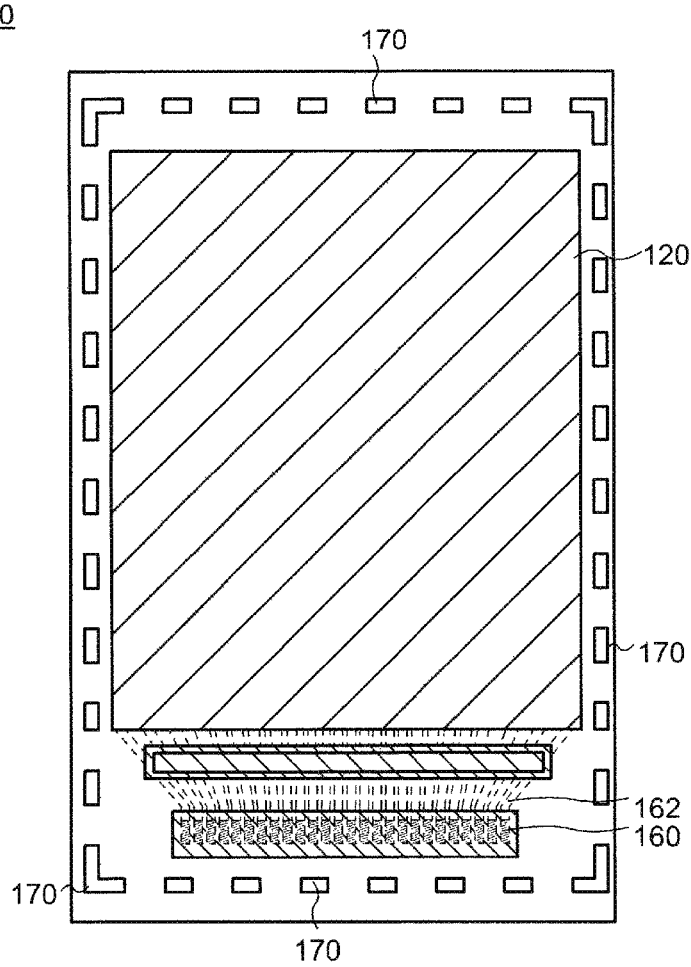
FIG. 12 is a drawing showing a fabrication method of a display device of an embodiment of the present invention.

As shown in FIG. 12, in the present embodiment, a plurality of linear-shape trenches 170 is formed discontinuously so as to surround the display region 120 and the terminal 160 and to form linear dotted lines parallel to any one of the sides of the display region 120. A part of the trenches 170 has a bent portion and a plurality of regions which are parallel to two sides of the display region 120, respectively.

Similar to Embodiment 4, the adhesion between the supporting substrate 105 and the base substrate 110 can be readily controlled by applying the structure of the present embodiment.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A manufacturing method of a display device, the manufacturing method comprising:
    disposing a base substrate on a supporting substrate having a top surface;
    forming a display region and a terminal over a second top surface of the base substrate, the second top surface of the base substrate overlapping the top surface, so that the terminal is sandwiched between the display region and a side surface of the base substrate;
    dividing the supporting substrate and then removing a part of the base substrate in a region between the side surface and the terminal so as to form a trench at the second top surface of the base and to expose the supporting substrate;
    connecting a connector to the terminal using an anisotropic conductive film after forming the trench; and
    separating the supporting substrate from the base substrate after connecting the connector.

2. The manufacturing method according to claim 1, wherein the removing the part of the base substrate is performed so that more than one trench surrounding the display region and the terminal is formed at the second top surface of the base substrate.

3. The manufacturing method according to claim 2, wherein the display region includes a plurality of sides, and
wherein each of the plurality of sides opposes at least two of the plurality of trenches.

4. The manufacturing method according to claim 2, wherein each of the plurality of trenches is linear.

5. The manufacturing method according to claim 4, wherein the trenches surround the display region.

6. The manufacturing method according to claim 2, wherein the division of the supporting substrate is performed after forming the display region and the terminal.

7. The manufacturing method according to claim 1, wherein the part of the base substrate is removed by laser irradiation.

8. The manufacturing method according to claim 1, wherein the trench is formed so as to be spaced from the terminal.

9. The manufacturing method according to claim 1, wherein the trench is formed so as to be spaced from the side surface by a distance equal to or larger than 100 μm and equal to or smaller than 500 μm.

10. The manufacturing method according to claim 1, wherein the terminal is electrically connected with the connector.

11. The manufacturing method according to claim 10, wherein the terminal and the connector are connected so that the anisotropic conductive film is spaced from the trench.

12. The manufacturing method according to claim 1, wherein the trench surrounds the display region.

* * * * *